United States Patent [19]

Iwahashi et al.

[11] Patent Number: 4,473,762

[45] Date of Patent: Sep. 25, 1984

[54] SEMICONDUCTOR INTEGRATED CIRCUIT WITH A RESPONSE TIME COMPENSATED WITH RESPECT TO TEMPERATURE

[75] Inventors: Hiroshi Iwahashi, Yokohama; Masamichi Asano, Musashino, both of Japan

[73] Assignee: Tokyo Shibaura Denki Kabushiki Kaisha, Kanagawa, Japan

[21] Appl. No.: 312,074

[22] Filed: Oct. 16, 1981

[30] Foreign Application Priority Data

Oct. 22, 1980 [JP] Japan ................................ 55-147922

[51] Int. Cl.³ .................... H03K 17/14; H03K 17/687
[52] U.S. Cl. ..................................... 307/594; 307/297;
 307/310; 307/443; 307/591; 330/289
[58] Field of Search ............... 307/310, 297, 591, 592,
 307/594, 595, 605, 443; 330/277, 289; 323/312

[56] References Cited

U.S. PATENT DOCUMENTS

| 3,700,934 | 10/1972 | Swain | 307/310 |
| 3,970,875 | 7/1976 | Leehan | 307/297 X |
| 3,987,318 | 10/1976 | Meijer | 307/310 |
| 4,008,406 | 2/1977 | Kawagoe | 307/310 X |
| 4,020,367 | 4/1977 | Yamashiro et al. | 307/297 |
| 4,293,782 | 10/1981 | Tanaka et al. | 307/310 X |

Primary Examiner—Stanley D. Miller
Assistant Examiner—David R. Hudspeth
Attorney, Agent, or Firm—Cushman, Darby & Cushman

[57] ABSTRACT

A current-controlling MOS transistor is connected between a power source and an MOS circuit. A control voltage which has a level related to temperature is applied to the gate electrode of the control MOS transistor in order to compensate for current reduction at high temperatures due to the lowering of the mobility of minority carriers. The response time of the MOS circuit is made less dependent on temperature as a result of the current compensation.

27 Claims, 18 Drawing Figures

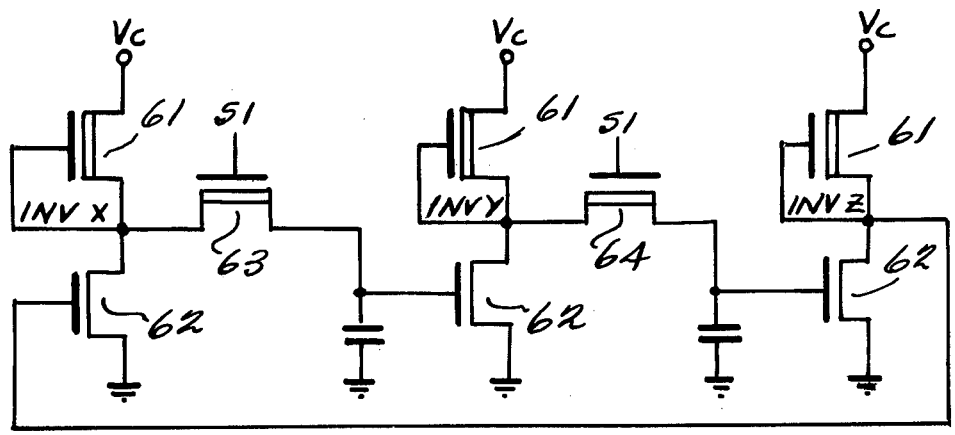
F I G. 16
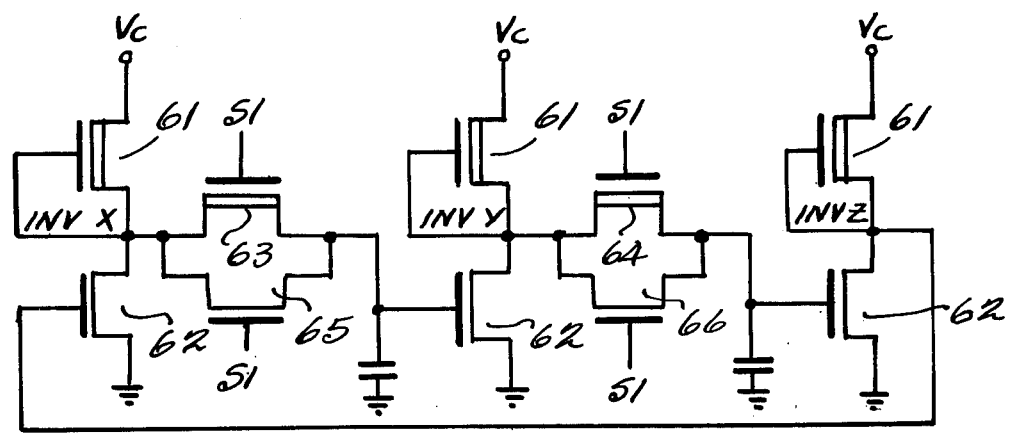
F I G. 17
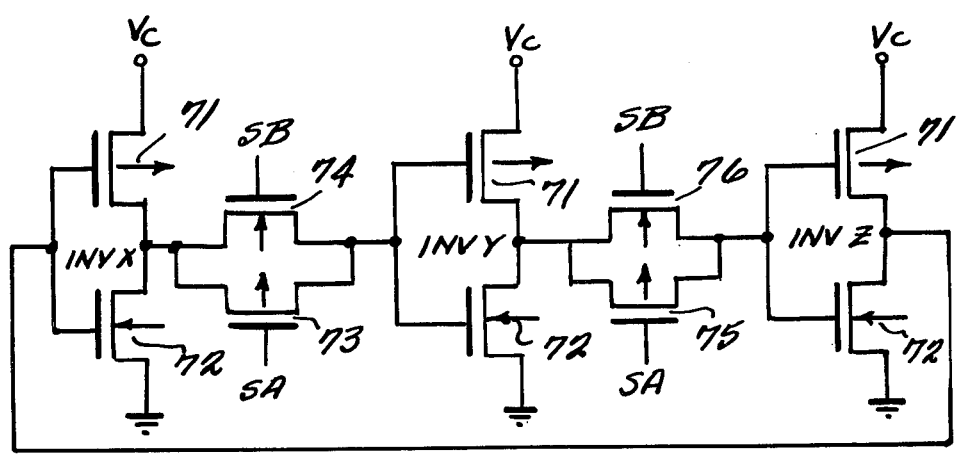
F I G. 18

SEMICONDUCTOR INTEGRATED CIRCUIT WITH A RESPONSE TIME COMPENSATED WITH RESPECT TO TEMPERATURE

BACKGROUND OF THE INVENTION

I. Field of the Invention

This invention relates to a semiconductor integrated circuit with high operating speed, and more particularly to a semiconductor integrated circuit wherein the operating speed is not influenced by temperature.

II. Description of the Prior Art

Generally, the current through an IGFET, such as a metal oxide semiconductor (MOS) transistor, decreases with increased temperature due to the lowering of the mobility of the minority carriers (electrons or holes). Accordingly, the response time in conventional MOS integrated circuits increases with temperature. For instance, the response time at 85° C. is 400 n.sec., as compared to 300 n.sec. at 25° C. due to the fact that as the current through an MOS transistor decreases with temperature, the charge-discharge current at some circuit points decreases and more time is required to charge and discharge it. Accordingly, the operating speed of a conventional device is influenced by temperature as shown in FIG. 1. The solid line and dotted line show response time and current through an MOS transistor, respectively.

SUMMARY OF THE INVENTION

Therefore, one object of this invention is to provide a semiconductor integrated circuit in which the operating speed is constant independent of temperature.

Another object of this invention is to provide a semiconductor integrated circuit in which the operating speed is very high.

Yet another object of this invention is to provide a semiconductor integrated circuit in which the reduction of operating speed at high temperatures is compensated.

According to this invention, a semiconductor integrated circuit comprises: (a) a first power source; (b) a second power source; (c) an MOS (Metal Oxide Semiconductor) circuit connected between the power sources; (d) a control signal generating means for generating a control voltage corresponding to temperature; (e) a control MOS transistor connected between the first power source and the MOS circuit, the control signal being applied to the gate electrode of the control MOS transistor so as to control the current through the MOS transistor.

BRIEF DESCRIPTION OF THE DRAWINGS

A more complete appreciation of the invention and many of the attendant advantages thereof will be readily obtained as the same becomes better understood by reference to the following detailed description when considered in connection with an accompanying drawing, wherein:

FIGS. 9 to 12, 14, 16, 17 and 18 show semiconductor integrated circuits of other embodiments according to the present ivention.

DESCRIPTION OF THE PREFERRED EMBODIMENT

There will now be discussed a semiconductor integrated circuit according to one embodiment of this invention with reference FIG. 2.

Figure 3:
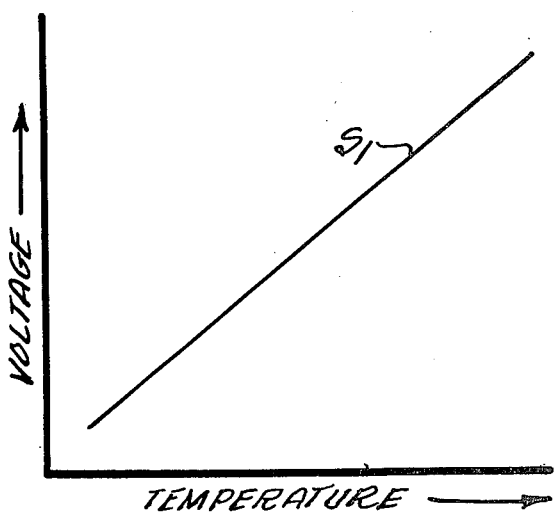
FIGS. 3, 5, 13 and 15 show control signals applied to control MOS transistors.

A three stage inverter circuit (INV1, INV2 and INV3) is constructed by depletion type MOS transistors 1, 2 and 3 as loads and enhancement type MOS transistors 4, 5 and 6 as driving transistors. Furthermore, enhancement type control MOS transistors 7, 8 and 9 are respectively connected between power source $V_c$ and MOS transistors 1, 2 and 3. A control voltage $S_1$ (shown in FIG. 3) is generated by control signal generating means 10 and is applied to the gate electrodes of MOS transistors 7, 8 and 9. As indicated in FIG. 3, control voltage $S_1$ increases with temperature. In this embodiment, N channel type MOS transistors are employed but of course P channel type MOS transistors could be used.

Figure 4:
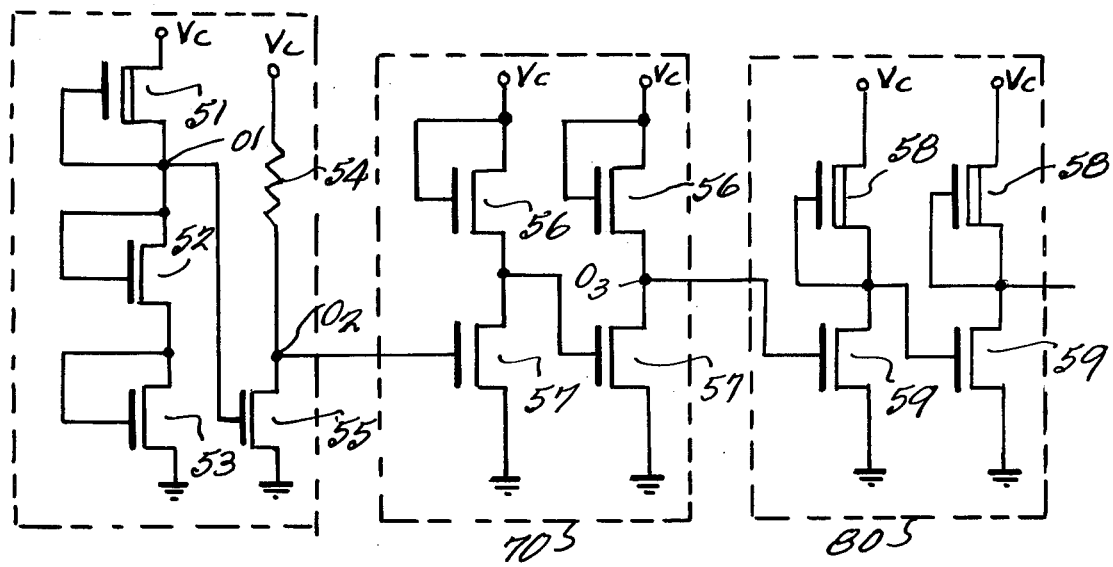
FIG. 4 shows a control signal generating circuit according to the present invention.
Figure 5:
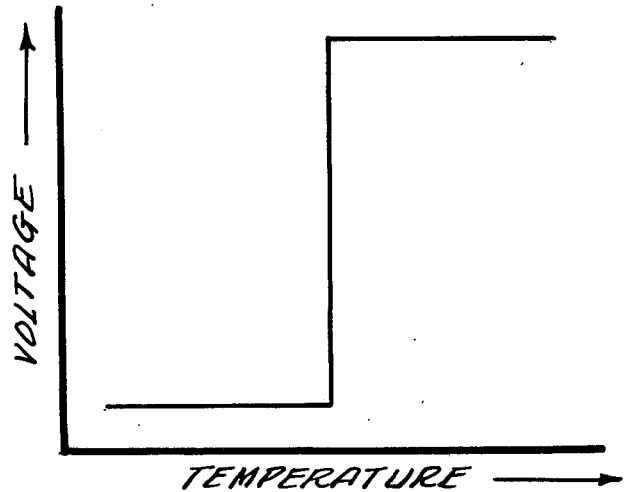

One example of control signal generating means 10 is shown in FIG. 4. The control signal generating means generates a control voltage which increases in proportion to temperature as shown in FIG. 3 or increases stepwise as shown in FIG. 5. Depletion type MOS transistor 51 whose gate electrode is connected with its own source electrode is connected between power source $V_c$ and first output terminal $O_1$. Two enhancement type MOS transistors 52 and 53 having gate electrodes connected to their drain electrodes respectively are connected between first output terminal $O_1$ and ground in series. A resistor element 54 made from polysilicon is connected between power source $V_c$ and second output terminal $O_2$ and an enhancement type MOS transistor 55 whose gate electrode is connected to the first output terminal $O_1$ is provided between second output terminal $O_2$ and ground. The output signal from the second output terminal $O_2$ is amplified by amplifier circuit 70 composed of two amplifier stages each consisting of MOS transistors 56 and 57. The output signal from third output terminal $O_3$ is transformed by a transforming circuit 80 composed of two inverters $INV_1$ and $INV_2$ each consisting of depletion type MOS transistor 58 and enhancement type MOS transistor 59. In this circuit, if the threshold voltage of MOS transistors 52, 53 and 55 is equally Vth, the output voltage $V_{01}$ of the first output terminal at room temperature becomes $$V_{01} = 2Vth + \alpha (\alpha \geq 0) \tag{1}$$

where $\alpha$ is the voltage drop caused by the internal resistance (very small) of transistors 52 and 53, and the effective threshold voltage Vth of MOS transistor 55 from output voltage $V_{01}$ becomes $$V_g - V_{th} = (2V_{th} + \alpha) - V_{th} = V_{th} + \alpha \qquad (2)$$

Figure 6:
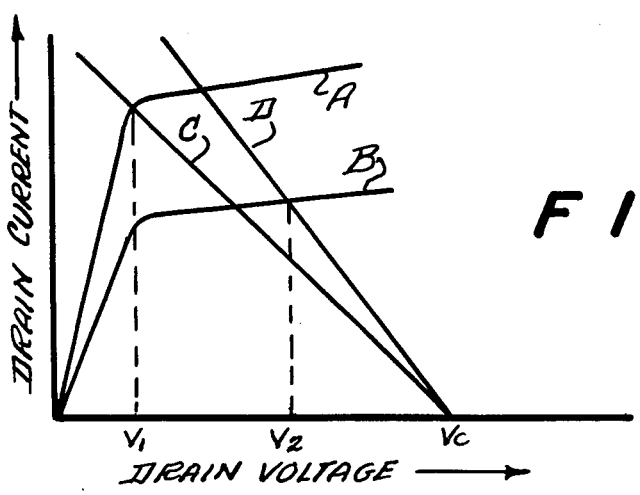
FIG. 6 shows a diagram of the characteristics of drain current with respect to drain voltage.

Generally, the threshold voltage of an MOS transistor decreases with temperature rise, therefore the threshold voltage of an MOS transistor becomes $(V_{th} - \beta)$ at raised temperature T°C. Accordingly, the effective gate voltage in equation (2) is $(V_{th} - \beta) + \alpha$. Namely, the voltage applied to the gate electrode of MOS transistor 55 decreases by $\beta$ as the mobility of minority carriers decreases, which results in a shift (from A to B as shown in FIG. 6) of the curve which shows characteristics of drain current with respect of drain voltage of MOS transistor 55. On the other hand, the resistor element made from polysilicon has a negative temperature characteristic. Therefore, the load curve shifts from C to D. Accordingly, the output voltage $V_{02}$ of the second output terminal $O_2$ changes from $V_1$ to $V_2$ and the control signal as shown in FIG. 3 can be obtained by amplifying the output $V_{02}$ by amplifier circuit 70. Furthermore, the step type control signal as shown in FIG. 5 can be obtained by transforming the output signal of amplifier circuit 70 by a transforming circuit 80.

Generally, it is well known that polysilicon may have either a positive or negative temperature characteristic with respect to resistor value. Of course, it is possible to employ a polysilicon resistor element which has a positive temperature characteristic, but it is desirable to use a polysilicon resistor element with a negative temperature characteristic so that $V_{02}$ changes by a large degree.

Figure 7:
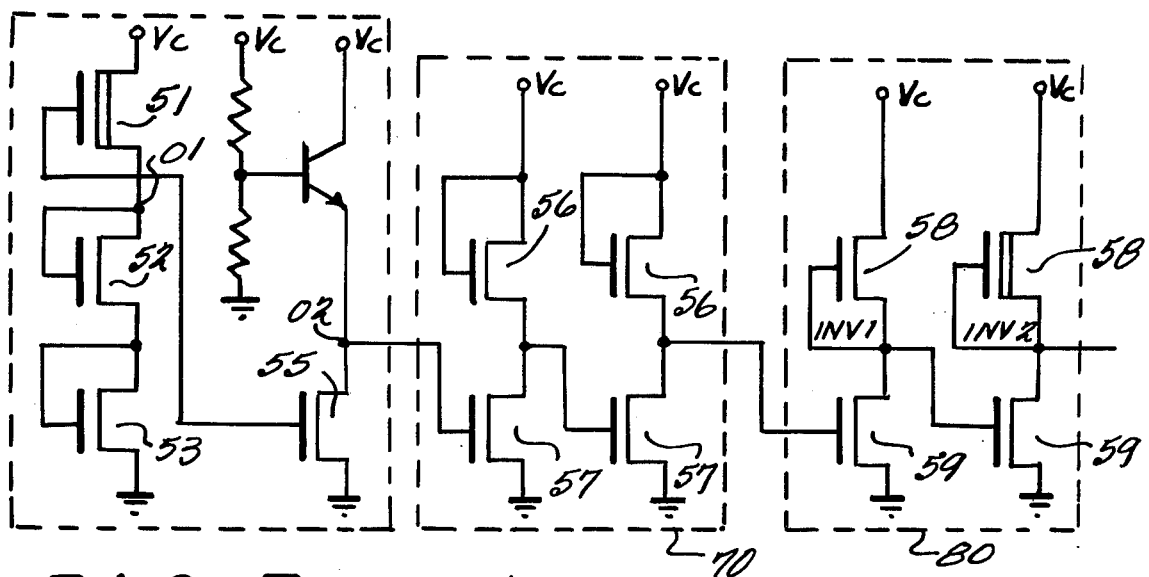
FIG. 7 shows a control signal generating circuit of another embodiment according to the present invention.

FIG. 7 shows another embodiment of the control signal generating circuit. A bipolar transistor is used in place of resistor element.

Figure 1:
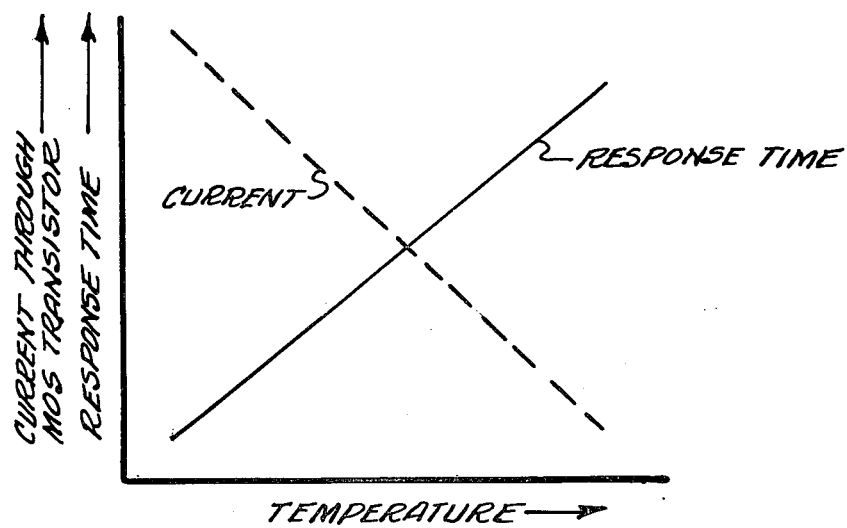
FIG. 1 shows a diagram of the characteristics of the current through a conventional MOS transistor and response time of a conventional MOS transistor circuit with respect to temperature.
Figure 2:
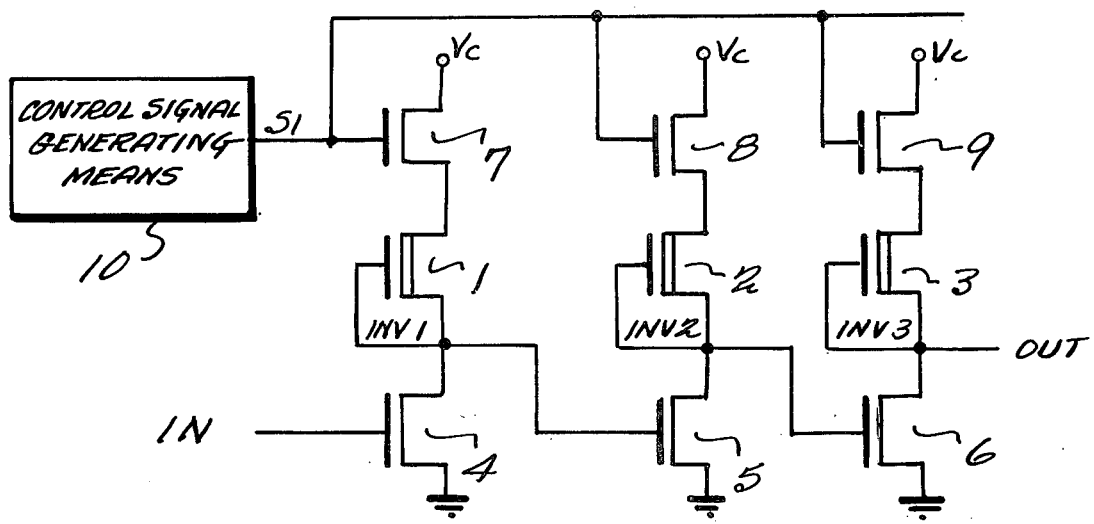
FIG. 2 shows a semiconductor integrated circuit of a preferred embodiment of the present invention.
Figure 8:
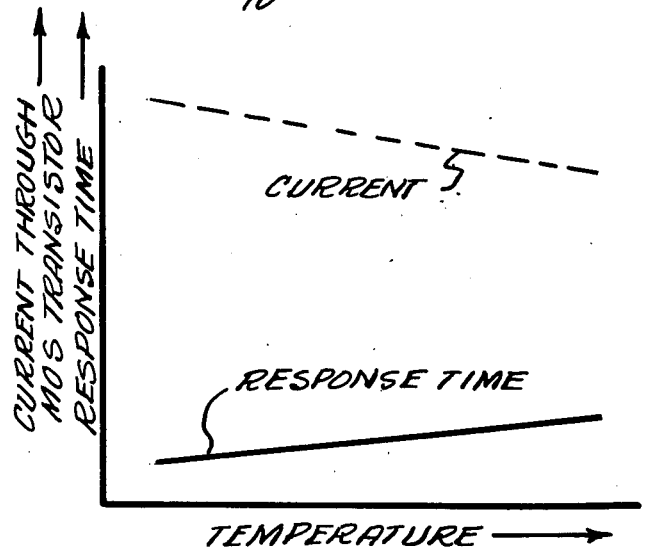
FIG. 8 shows a diagram of the characteristics of the current through an MOS transistor circuit, according to the present invention, with respect to temperature.

In the inverter circuit shown in FIG. 2, MOS transistors 7, 8 and 9 are selected so that the response time and the current through each inverter stage are determined by them and the MOS transistors 1, 2, 3 and 4, 5, 6, and each stage can charge or discharge the load capacitance of following inverter stage. The reduction of current through each inverter stage at high temperature is prevented by changing the voltage applied to the gate electrodes of MOS transistors 7, 8 and 9 corresponding to the temperature. Therefore, it is possible to make the response time relatively constant, independent of temperature as shown in FIG. 8.

Figure 9:
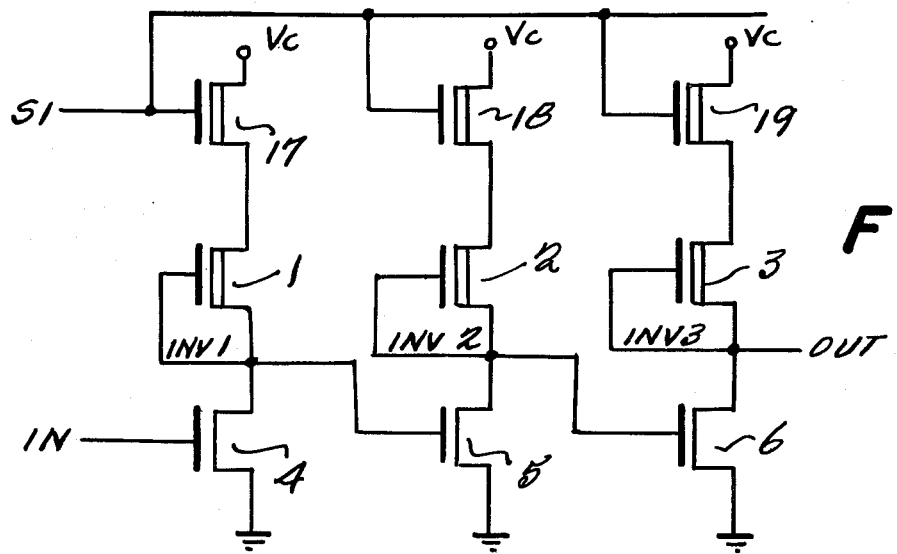

FIG. 9 shows a second embodiment according to this invention. Depletion type MOS transistors 17, 18 and 19, to which the control signal is applied, are used in place of enhancement type transistors 7, 8 and 9 in FIG. 2.

Figure 10:
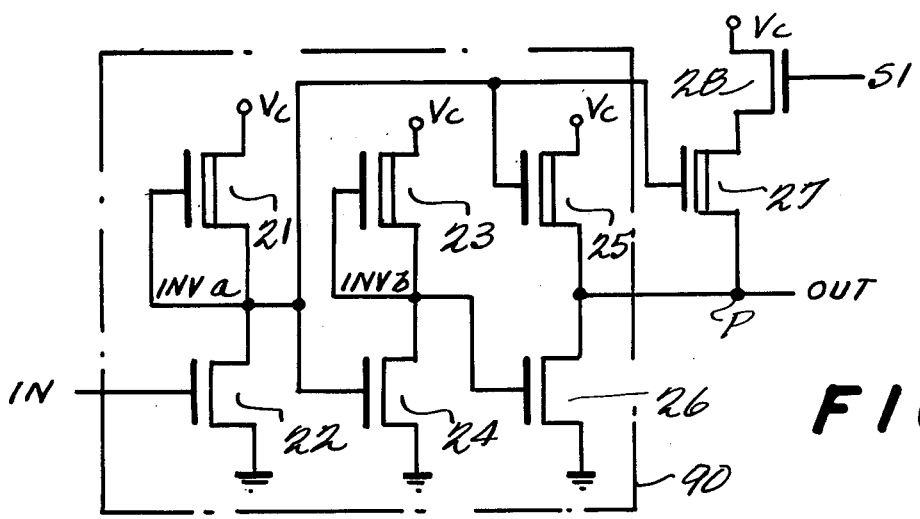

FIG. 10 shows a third embodiment of this invention. Generally a buffer circuit is employed, in a semiconductor integrated circuit using MOS transistors, to drive a circuit point with a large load capacitance. This embodiment employs a buffer circuit in accordance with this invention. The buffer circuit 90 is constructed by inverter stages $INV_a$ and $INV_b$ including depletion type MOS transistors 21 and 23 and enhancement type MOS transistors 22 and 24. Depletion type transistor 25 is controlled by the output of the first inverter stage $INV_a$ and enhancement type MOS transistor 26 is controlled by the output of the second inverter stage $INV_b$. The output terminal of the buffer circuit 90 is connected to circuit point P with a large load capacitance. Enhancement type MOS transistor 28 and depletion type MOS transistor 27 are connected in series between power source $V_c$ and circuit point P. The control signal $S_1$ and the output of the first inverter stage $INV_a$ are applied to gate electrodes of MOS transistors 28 and 27, respectively. When the input signal is low, MOS transistor 25 is rendered conductive. Any reduction of charge current at circuit point P caused by a temperature rise is prevented by applying control signal $S_1$ to the gate electrode of MOS transistor 28. In this embodiment, MOS transistor 28 may be a depletion type and it is possible to delete MOS transistor 27.

In an integrated circuit, the response time and current consumption depend on the number of circuit points with large load capacitance. Therefore, even if temperature compensation MOS transistors are provided only to the circuit points with large load capacitance, it is still very effective to make the operating speed constant.

Figure 11:
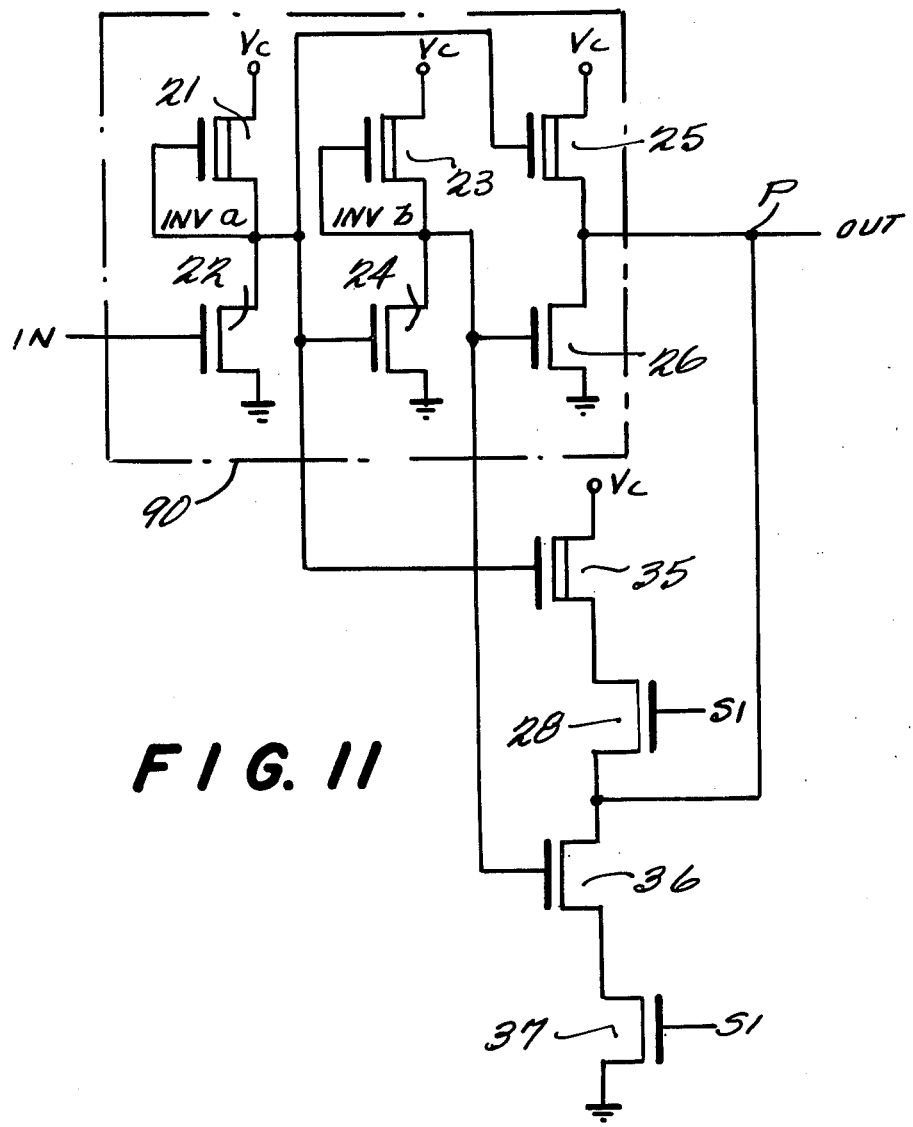

FIG. 11 shows a fourth embodiment according to this invention. This circuit is similar to that of FIG. 10, with the addition of MOS transistors 36 and 37 connected in series between circuit point P and ground. Gate electrodes of MOS transistors 35 and 36 are connected to output terminals of inverters $INV_a$ and $INV_b$, respectively. This circuit increases the discharging speed of circuit point P as well as charging speed.

Figure 12:
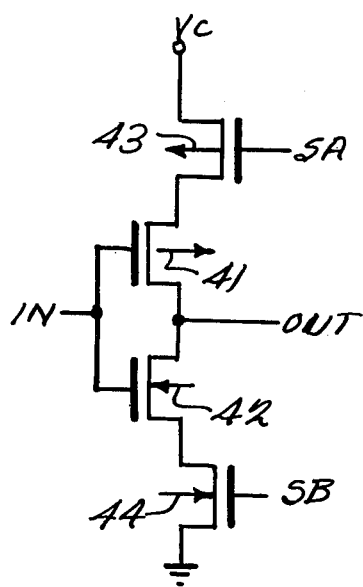
Figure 13:
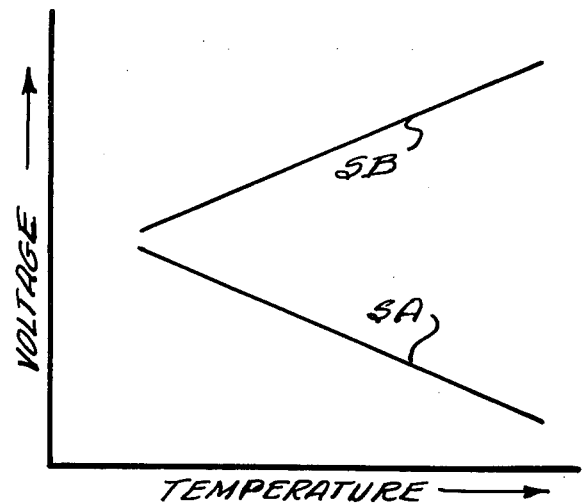

FIG. 12 shows a fifth embodiment according to this invention. The invention is applied to a CMOS circuit in contrast with circuits using N or P channel type MOS transistors shown in FIGS. 1 to 11. P channel type MOS transistor 43 and N channel type MOS transistor 44 are connected between an inverter circuit consisting of P channel type MOS transistor 41 and N channel type MOS transistor 42 and power sources ($V_{cc}$, Ground), respectively. Control signals $S_A$ whose voltage decreases with temperature rise and $S_B$ whose voltage increases with temperature rise (as shown in FIG. 13) are applied to gate electrodes of MOS transistors 43 and 44. The control signals $S_A$ and $S_B$ are generated by the control generating circuit shown in FIG. 4. In this embodiment, the current reduction associated with temperature rise is compensated for by applying such control signals to the gate electrodes of MOS transistors 43 and 44 that increase the current therethrough.

Figure 14:
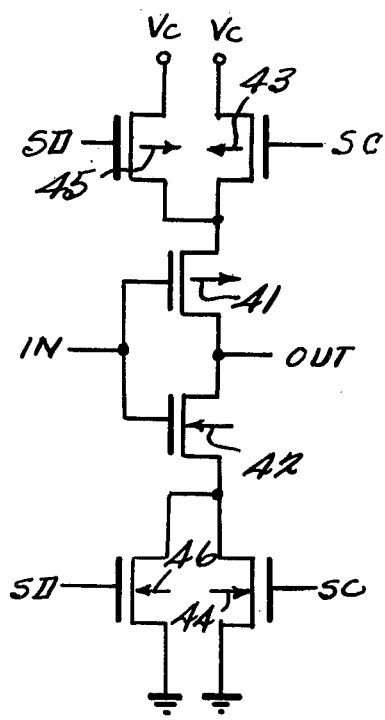
Figure 15:
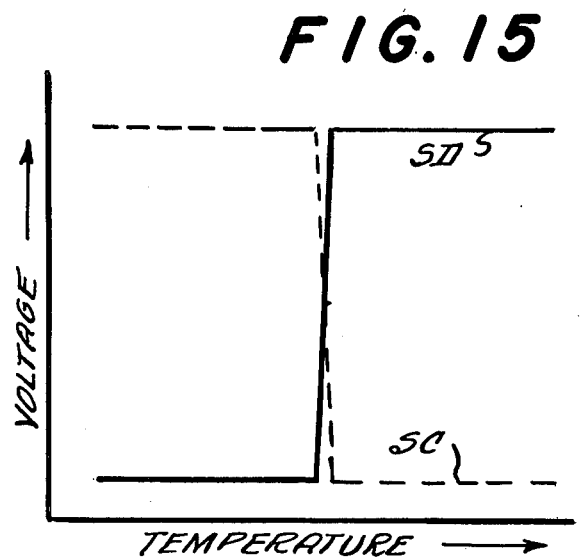

FIG. 14 shows a sixth embodiment according to this invention. P channel type MOS transistors 43 and 45 are connected in parallel between power source $V_c$ and an inverter circuit similar to that shown in FIG. 12, and control signals SC and SD, shown in FIG. 15, are applied to gate electrodes thereof, respectively. Similarly, N channel type MOS transistors 44 and 46 are connected in parallel between a power source (Ground) and the inverter circuit, and control signals SC and SD are applied to the gate electrodes thereof, respectively. In this embodiment, the channel width of the MOS transistors 44 and 45 is smaller than that of MOS transistors 43 and 46. The control signals SC and SD generated by a control signal generating circuit changes stepwise as shown in FIG. 15. Namely, the control signal SC changes from a high level to a low level and on the other hand the control signal SD changes from a low level to a high level at some temperature point $T_A$. MOS transistors 44 and 45 with small channel width are rendered conductive below temperature $T_A$, which results in a small current flow. MOS transistors 43 and 46, with large channel width, are rendered conductive above temperature $T_A$, which results in large current flow.

FIG. 16 shows a seventh embodiment according to this invention applied to an oscillator. The oscillator is composed of three inverter stages each consisting of depletion type MOS transistor 61 and enhancement type MOS transistor 62. Depletion type MOS transistors 63 and 64 are connected between inverter stages. Conventionally, a constant voltage was applied to the gate electrodes of MOS transistors 63 and 64. But, the oscillation frequency of prior art devices dropped due to the current reduction resulting from temperature rise. In this embodiment control signal $S_1$ is applied to the gate electrodes of MOS transistors 63 and 64 to prevent the reduction of oscillation frequency with temperature rise. It is also possible to raise the oscillation frequency with temperature rise.

FIG. 17 shows an eighth embodiment according to this invention. This embodiment is similar to that in FIG. 16 with the addition of enhancement type MOS transistors 65 and 66 connected in parallel with depletion type MOS transistors 63 and 64. Control signal $S_1$ is applied to the gate electrodes thereof.

FIG. 18 shows a ninth embodiment according to this invention. The oscillator is constructed by a CMOS circuit. P channel type MOS transistors 73, 75 and N channel type MOS transistors 74, 76 are coupled and inserted between inverter stages consisting of P channel type MOS transistor 71 and N channel type MOS transistor 72. Control signals SA and SB, shown in FIG. 13, are applied to the gate electrodes of MOS transistors 73 and 75, 74 and 76, respectively.

Although this invention has been disclosed and illustrated with reference to particular applications, the principles involved are susceptible of numerous other applications which will be apparent to those skilled in the art. The invention is, therefore, to be limited only as indicated by the scope of the claims.

What is claimed is:

1. A semiconductor integrated circuit comprising:
   a Metal Oxide Semiconductor (MOS) circuit characterized by being connectable to first and second power source terminals;
   a control signal generating means for generating a control voltage corresponding to temperature, the generating means including:
   a first output terminal,
   a second output terminal,
   a depletion type MOS transistor having a drain electrode connected to the first power source terminal, a source electrode connected to the first output terminal and a gate electrode connected to the source electrode,
   at least one enhancement type MOS transistor having source and drain electrode coupled between the first output terminal and the second power source terminal and having a gate electrode connected to the enhancement type MOS transistor drain electrode,
   a resistance element connected between the first power source terminal and the second output terminal,
   another enhancement type MOS transistor having source and drain electrodes coupled between the second output terminal and the second power source terminal and having a gate electrode connected to the first output terminal; and
   means, connected to the MOS circuit and responsive to the control signal, for reducing the dependency of the current through the MOS circuit on temperature.

2. The semiconductor integrated circuit according to claim 1 wherein said reducing means includes a control MOS circuit connected to said MOS circuit.

3. The semiconductor integrated circuit according to claim 2 wherein the control MOS circuit includes an MOS transistor having its current conducting path connected to the MOS circuit, said control signal being applied to a gate terminal of the MOS transistor.

4. A semiconductor circuit comprising:
   an MOS transistor having a gate terminal and first and second current conducting terminals, said first current conducting terminal being connected to a second power source terminal;
   means for applying an input signal to said gate terminal;
   means for receiving an output signal from said second current conducting terminal;
   means for generating a current at a level controlled by a voltage level, said current generating means being coupled between a first power source terminal and said second current conducting terminals; and
   control signal means for generating a voltage related to the temperature in the vicinity of said MOS transistor, said current generating means being responsive to said control signal generating means for generating a current which increases and decreases as temperature increases and decreases to stabilize response time of said MOS transistor with respect to temperature, the control signal generating means including:
   a first output terminal,
   a second output terminal,
   a depletion type MOS transistor having a drain electrode connected to the first power source terminal, a source electrode connected to the first output terminal and a gate electrode connected to the source electrode,
   at least one enhancement type MOS transistor having source and drain electrode coupled between the first output terminal and the second power source terminal and having a gate electrode connected to the enhancement type MOS transistor drain electrode,
   a resistance element connected between the first power source terminal and the second output terminal, and
   another enhancement type MOS transistor having source and drain electrodes coupled between the second output terminal and the second power source terminal and having a gate electrode connected to the first output terminal.

5. The semiconductor integrated circuit according to claim 1 or 4 further comprising an amplifier circuit connected to the second output terminal for amplifying signals at the second output terminal.

6. The semiconductor integrated circuit according to claim 5 further comprising a transforming circuit connected to the amplifier circuit, for outputting a step voltage as a function of temperature.

7. The semiconductor integrated circuit according to claim 1 or 4 wherein the control signal generating means includes means for generating a control voltage which changes stepwise at a predetermined temperature.

8. The semiconductor integrated circuit according to claim 1 or 4 wherein the resistance element has a negative temperature coefficient with respect to resistance.

9. A semiconductor integrated circuit comprising:
(a) a first power source terminal;
(b) a second power source terminal;
(c) means for generating a control voltage dependent on temperature;
(d) a control MOS transistor having a drain electrode connected to the first power source terminal, a gate electrode and a source electrode, said control voltage being applied to the gate electrode; and
(e) an inverter circuit including a depletion type MOS transistor and an enhancement type MOS transistor, said inverter circuit being connected between the source electrode of the control MOS transistor and the second power source terminal, wherein said control MOS transistor acts to reduce the dependency of the current through said inverter circuit upon the ambient temperature.

10. The semiconductor integrated circuit according to claim 9 wherein the integrated circuit is composed of N channel type MOS transistors and the control voltage increases with temperature.

11. The semiconductor integrated circuit according toclaim 9 wherein the integrated circuit is composed of P channel type MOS transistors and the control voltage decreases with temperature.

12. The semiconductor integrated circuit according to claim 9 wherein the control MOS transistor is enhancement type.

13. The semiconductor integrated circuit according to claim 9 wherein the control MOS transistor is depletion type.

14. A semiconductor integrated circuit comprising:
(a) a first power source terminal;
(b) a second power source terminal;
(c) a CMOS inverter circuit consisting of P channel type MOS transistor and N channel type MOS transistor;
(d) a first control MOS transistor of P channel type having a first current conducting electrode connected to the first power source terminal, a second current conducting electrode connected to the inverter circuit and a gate electrode;
(e) a second control MOS transistor of N channel type having a first current conducting electrode connected to the second power source terminal, a second current conducting electrode connected to the inverter circuit and a gate electrode;
(f) means for generating a first control voltage which decreases with increasing temperature and a second control voltage which increases with increasing temperature, said first control voltage being applied to said first control transistor gate and said second control voltage being applied to said second control transistor gate.

15. A semiconductor integrated circuit comprising:
(a) a first power source terminal;
(b) a second power source terminal;
(c) a CMOS inverter circuit consisting of a P channel type MOS transistor and an N channel type MOS transistor;
(d) a first and a second MOS transistor of P channel type having current conducting terminals coupled in parallel with each other and connected between the first power source terminal and the CMOS inverter circuit, the channel width of the second transistor being larger than the channel width of the first transistor;
(e) a third and a fourth MOS transistor of N channel type having current conducting terminals coupled in parallel with each other and connected between the second power source and the CMOS inverter circuit, the channel width of the third transistor being larger than that of the fourth transistor; and
(f) means for generating a first control voltage which rises stepwise with temperature and a second control voltage which decreases stepwise with temperature, said first control voltage being applied to gate electrodes of said first and third transistors and said second control voltage being applied to gate electrodes of said second and fourth transistors.

16. A semiconductor integrated circuit comprising:
(a) a first power source terminal;
(b) a second power source terminal;
(c) a buffer circuit having a driver circuit consisting of a load and a first MOS transistor having a gate for buffering an input signal, and current conducting terminals connected in series with the load between the first and second power source terminals;
(d) control MOS circuit means, including a control MOS transistor and a second MOS transistor each having current conducting terminals connected in series between the first power source terminal and a current conducting terminal of the first MOS transistor and a gate, for reducing the dependence on temperature of the switching speed of said output terminal, in cooperation with
(e) means for providing complementary signals to the gates of the control and second MOS transistors.

17. A semiconductor integrated circuit according to claim 16 wherein said control circuit means comprises means for generating a control voltage related to temperature, said gate of the control MOS transistor being responsive to said control signal.

18. The semiconductor integrated circuit according to claim 17 wherein the control MOS transistor is N channel type and the control voltage increases with temperature.

19. The semiconductor integrated circuit according to claim 17 wherein the control MOS transistor is P channel type and the control voltage decreases with temperature.

20. A semiconductor integrated circuit comprising:
(a) a first MOS transistor circuit characterized by being connectable between first and second power source terminals;
(b) a second MOS transistor circuit characterized by being connectable between said first and second power source terminals;
(c) a control MOS circuit having a first terminal connected to the first MOS transistor circuit, a second terminal connected to the second MOS transistor circuit and a control terminal; and
(d) means, coupled to said control terminal, for generating a control voltage corresponding to temperature, the generating means including:
a first output terminal,
a second output terminal,
a depletion type MOS transistor having a drain electrode connected to the first power source terminal, a source electrode connected to the first output terminal and a gate electrode connected to the source electrode,
at least one enhancement type MOS transistor having source and drain electrode coupled between the first output terminal and the second power source terminal and having a gate electrode connected to the enhancement type MOS transistor drain electrode, a resistance element connected between the first power source terminal and the second output terminal, and another enhancement type MOS transistor having source and drain electrodes coupled between the second output terminal and the second power source terminal and having a gate electrode connected to the first output terminal.

21. A semiconductor integrated circuit according to claim 20 wherein said control circuit comprises a control MOS transistor having current conducting electrodes connected to the first and second circuits, respectively, and a control terminal responsive to the control voltage.

22. The semiconductor integrated circuit according to claim 21 wherein the control MOS transistor is N channel type and the control voltage increases with temperature.

23. The semiconductor integrated circuit according to claim 21 wherein the control MOS transistor is P channel type and the control voltage decreases with temperature.

24. A semiconductor integrated circuit comprising:
(a) a first MOS transistor circuit characterized by being connectable between first and second power source terminals;
(b) a second MOS transistor circuit characterized by being connectable between said first and second power source terminals;
(c) a control MOS circuit having means for generating a control voltage related to temperature, a first control MOS transistor being of a depletion type and having current conducting electrodes connected to the first and second circuits, respectively, and a control terminal controlled by the control voltage, and a second control MOS transistor of enhancement type having current conducting terminals connected in parallel with the current conducting electrodes of the depletion type control MOS transistor and a control terminal controlled by the control voltage having current conducting terminals.

25. A semiconductor integrated circuit comprising:
(a) first and second MOS circuits, each consisting of P channel type and N channel type MOS transistors and characterized by being connectable between voltage sources;
(b) a first control MOS transistor of N channel type and a second control MOS transistor of P channel type each having a first electrode connected to the first CMOS circuit, a second electrode connected to the second CMOS circuit and a control electrode; and
(c) means for generating a first control signal increasing with temperature and a second control signal decreasing with temperature, the first control signal being applied to the control electrode of the first control transistor and the second control signal being applied to the control electrode of the second control transistor.

26. A semiconductor integrated circuit comprising:
(a) a first power source terminal;
(b) a second power source terminal;
a buffer circuit, connected to said first and second power source terminals, and having an input terminal and an output terminal;
(d) control MOS circuit means for reducing the dependence on temperature of the switching speed of said output terminal, said control means including:
a control MOS transistor and a switching MOS transistor each having current conducting terminals connected in series between the first power source terminal and the output terminal of the buffer circuit,
means for generating a control voltage related to temperature, a gate of said control MOS transistor being controlled by said control voltage generating means, and
means for generating a switching signal when a level at the output of the buffer circuit approaches a level of the first power source terminal, said switching signal generating means connected to a gate of said switching MOS transistor.

27. A semiconductor integrated circuit comprising:
(a) a first power source terminal;
(b) a second power source terminal;
(c) a buffer circuit having an input terminal and an output terminal;
(d) control MOS circuit means for reducing the dependence on temperature of the switching speed of said output terminal, said control means including:
a first control MOS transistor having current conducting terminals coupled between the first power source terminal and the output terminal,
a second control MOS transistor having current conducting terminals coupled between the second power source terminal and the output terminal, and
means for generating first and second control voltages related to temperature, gates of the first and second control MOS transistors being responsive to the first and second control voltages, respectively.

* * * * *